(12) United States Patent
Park et al.

(10) Patent No.: US 12,289,963 B2
(45) Date of Patent: Apr. 29, 2025

(54) DISPLAY DEVICE AND METHOD OF MANUFACTURING THE SAME

(71) Applicant: SAMSUNG DISPLAY CO., LTD., Yongin-si (KR)

(72) Inventors: Gwuihyun Park, Yongin-si (KR); Pilsoon Hong, Buchen-si (KR); Hyein Kim, Yongin-si (KR); Chulwon Park, Yongin-si (KR); Koichi Sugitani, Yongin-si (KR); Hyungbin Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/127,390

(22) Filed: Mar. 28, 2023

(65) Prior Publication Data
US 2023/0240099 A1 Jul. 27, 2023

Related U.S. Application Data

(62) Division of application No. 16/992,690, filed on Aug. 13, 2020, now Pat. No. 11,637,158.

(30) Foreign Application Priority Data

Nov. 18, 2019 (KR) .................. 10-2019-0148088

(51) Int. Cl.
*H10K 59/122* (2023.01)
*H10K 59/12* (2023.01)
*H10K 59/124* (2023.01)

(52) U.S. Cl.
CPC ......... *H10K 59/122* (2023.02); *H10K 59/124* (2023.02); *H10K 59/1201* (2023.02)

(58) Field of Classification Search
CPC ............. H10K 59/1201; H10K 59/121; H10K 59/122; H10K 59/124
See application file for complete search history.

(56) References Cited

U.S. PATENT DOCUMENTS

| 9,096,777 | B2 | 8/2015 | Bockmeyer et al. |
| 9,564,611 | B2 | 2/2017 | Moon et al. |
| 10,044,002 | B2 | 8/2018 | Lee et al. |
| 10,276,640 | B2 | 4/2019 | Chung et al. |

(Continued)

FOREIGN PATENT DOCUMENTS

| CN | 102627913 A | 8/2012 |
| CN | 105355645 A | 2/2016 |

(Continued)

OTHER PUBLICATIONS

Chinese Office Action for Chinese Patent Application No. 202011295371.9 dated Aug. 15, 2024.

(Continued)

*Primary Examiner* — Vongsavanh Sengdara
(74) *Attorney, Agent, or Firm* — CANTOR COLBURN LLP

(57) ABSTRACT

A display device includes: a substrate; a display area in which a plurality of pixels are arranged over the substrate; and a transmission area arranged inside the display area, where the transmission area is provided to overlap a component below the substrate, and a transparent organic layer including siloxane is arranged in the transmission area.

9 Claims, 15 Drawing Sheets

(56) References Cited

U.S. PATENT DOCUMENTS

| | | | |
|---|---|---|---|
| 10,290,558 B2 | 5/2019 | Rantala et al. | |
| 10,403,855 B2 | 9/2019 | Liang et al. | |
| 11,333,915 B2 | 5/2022 | Yu et al. | |
| 11,411,201 B2 | 8/2022 | Liu | |
| 2010/0213559 A1* | 8/2010 | Mizuno | H01L 27/14685 |
| | | | 257/E31.127 |
| 2017/0214003 A1* | 7/2017 | Lee | H10K 59/121 |
| 2017/0256747 A1* | 9/2017 | Lee | H10K 50/856 |
| 2017/0287992 A1 | 10/2017 | Kwak et al. | |
| 2018/0076411 A1* | 3/2018 | Kim | H10K 59/121 |
| 2019/0181205 A1 | 6/2019 | Kim | |
| 2019/0214601 A1* | 7/2019 | Park | H10K 50/11 |
| 2019/0280224 A1* | 9/2019 | Wang | H10K 59/126 |

FOREIGN PATENT DOCUMENTS

| | | |
|---|---|---|
| CN | 106158740 A | 11/2016 |
| CN | 103915482 B | 3/2017 |
| CN | 107863448 A | 3/2018 |
| CN | 108232031 A | 6/2018 |
| CN | 109001933 A | 12/2018 |
| CN | 109283722 A | 1/2019 |
| CN | 109411519 A | 3/2019 |
| CN | 110164939 A | 8/2019 |
| CN | 110289286 A | 9/2019 |
| CN | 110456543 A | 11/2019 |
| KR | 1020160027525 A | 3/2016 |
| KR | 1020170023985 A | 3/2017 |
| KR | 1020170029041 A | 3/2017 |
| KR | 1020170088457 A | 8/2017 |
| KR | 1020170111827 A | 10/2017 |
| KR | 20180061902 A | 6/2018 |
| KR | 1020190067968 A | 6/2019 |

OTHER PUBLICATIONS

Chinese Office Action mailed Dec. 28, 2024 in CN Patent Application No. 202011295371.9, 23 pages.

Fan et al., "Preparation and properties of reinforced transparent electronic encapsulant," Optics and Precision Engineering, vol. 26, No. 9, Sep. 2018, 5 pages.

Hu et al., "Synthesis and properties of high refractive index silicone resin for high power LED encapsulation," Chemical Industry and Engineering Progress, 2017, 7 pages.

Shuanggui et al., "Preparation and Properties of High Transmittance Silicone Pouring Sealant for Electronic Component," China Academic Journal Electronic Publishing House, 2014, 4 pages.

Decision of Rejection issued Mar. 18, 2025 in CN Patent Application No. 202011295371.9, 8 pages.

* cited by examiner

DISPLAY DEVICE AND METHOD OF MANUFACTURING THE SAME

This application is a divisional of U.S. patent application Ser. No. 16/992,690, filed on Aug. 13, 2020, which claims priority to Korean Patent Application No. 10-2019-0148088, filed on Nov. 18, 2019, and all the benefits accruing therefrom under 35 U.S.C. § 119, the content of which in its entirety is herein incorporated by reference.

BACKGROUND

1. Field

One or more embodiments relate to a display device and a method of manufacturing the display device.

2. Description of Related Art

Recently, the purposes of display devices have been diversifying. In addition, as display devices have become thinner and more lightweight, the range of use of such display device has gradually been extended.

As display devices are used in various ways, the shapes of the display device may be designed in various ways. Also, functions that may be combined or associated with display devices are increasing.

SUMMARY

One or more embodiments include a display device including a transmission area in a display area, a component such as a camera being arranged in the transmission area, and a method of manufacturing the display device. One or more embodiments include a display device in which a transmittance of a transmission area is stably improved, and a method of manufacturing the display device. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments of the disclosure.

According to an embodiment, a display device includes a substrate, a display area including a plurality of pixels arranged over the substrate, and a transmission area arranged inside the display area, where the transmission area is disposed to overlap a component below the substrate, and a transparent organic layer including siloxane is arranged in the transmission area on the substrate.

In an embodiment, the substrate may include a first base layer, a first barrier layer, a second base layer and a second barrier layer, which are sequentially stacked one on another, a groove may be defined in the transmission area by removed portions of the second base layer and the second barrier layer or by a removed portion of the second barrier layer, and the groove may be filled with the transparent organic layer.

In an embodiment, the transparent organic layer may include a plurality of siloxane layers stacked in a multi-layer structure.

In an embodiment, The pixel in the display area may include a semiconductor layer, a gate electrode, a source electrode, a drain electrode, a pixel electrode and a pixel-defining layer, the semiconductor layer may be over the substrate, the gate electrode may face the semiconductor layer, the source electrode and the drain electrode may be connected to the semiconductor layer, the pixel electrode may be connected to the drain electrode with an organic insulating layer therebetween, and the pixel-defining layer may surround edges of the pixel electrode. In such an embodiment, the transparent organic layer may include a central siloxane layer and a top siloxane layer on the central siloxane layer, the central siloxane layer may be arranged on a same layer as a layer on which the organic insulating layer is arranged, and the top siloxane layer may be arranged on a same layer as a layer on which the pixel-defining layer is arranged.

In an embodiment, the transparent organic layer may further include a bottom siloxane layer arranged between a bottom surface of the groove and the central siloxane layer.

In an embodiment, a surface of the top siloxane layer and a surface of the central siloxane layer may be arranged on a same plane such that there is no protruded portion between the top siloxane layer and the central siloxane layer.

In an embodiment, a surface of the top siloxane layer may be higher than a surface of the central siloxane layer.

In an embodiment, a height of the surface of the top siloxane layer may be substantially the same as a height of a surface of the pixel-defining layer.

In an embodiment, a surface of the central siloxane layer may be higher than a surface of the top siloxane layer.

In an embodiment, the transparent organic layer may include Si, O, or C-based siloxane.

According to another embodiment, a method of manufacturing a display device includes forming a display area in which a plurality of pixels are arranged over a substrate, and forming a transmission area, in which a transparent organic layer is arranged to overlap a component below the substrate, inside the display area, where the transparent organic layer includes siloxane.

In an embodiment, the substrate may include a first base layer, a first barrier layer, a second base layer, and a second barrier layer, which are sequentially stacked one on another, and the forming the transmission area may include: forming a groove by removing portions of the second base layer and the second barrier layer or by removing a portion of the second barrier layer, and filling the groove with the transparent organic layer.

In an embodiment, the transparent organic layer may include a plurality of siloxane layers stacked in a multi-layer structure.

In an embodiment, the pixel in the display area may include a semiconductor layer, a gate electrode, a source electrode, a drain electrode, a pixel electrode and a pixel-defining layer, the semiconductor layer may be over the substrate, the gate electrode may face the semiconductor layer, the source electrode and the drain electrode may be connected to the semiconductor layer, the pixel electrode may be connected to the drain electrode with an organic insulating layer therebetween, and the pixel-defining layer may surround edges of the pixel electrode. In such an embodiment, the transparent organic layer may include a central siloxane layer and a top siloxane layer on the central siloxane layer, the central siloxane layer may be arranged on a same layer as a layer on which the organic insulating layer is arranged, and the top siloxane layer may be arranged on a same layer as a layer on which the pixel-defining layer is arranged.

In an embodiment, the transparent organic layer may further include a bottom siloxane layer arranged between a bottom surface of the groove and the central siloxane layer.

In an embodiment, a surface of the top siloxane layer and a surface of the central siloxane layer may be arranged on a same plane such that there is no protruded portion between the top siloxane layer and the central siloxane layer.

In an embodiment, a surface of the top siloxane layer may be higher than a surface of the central siloxane layer.

In an embodiment, a height of the surface of the top siloxane layer may be substantially the same as a height of a surface of the pixel-defining layer.

In an embodiment, a surface of the central siloxane layer may be higher than a surface of the top siloxane layer.

In an embodiment, the transparent organic layer may include Si, O, or C-based siloxane.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
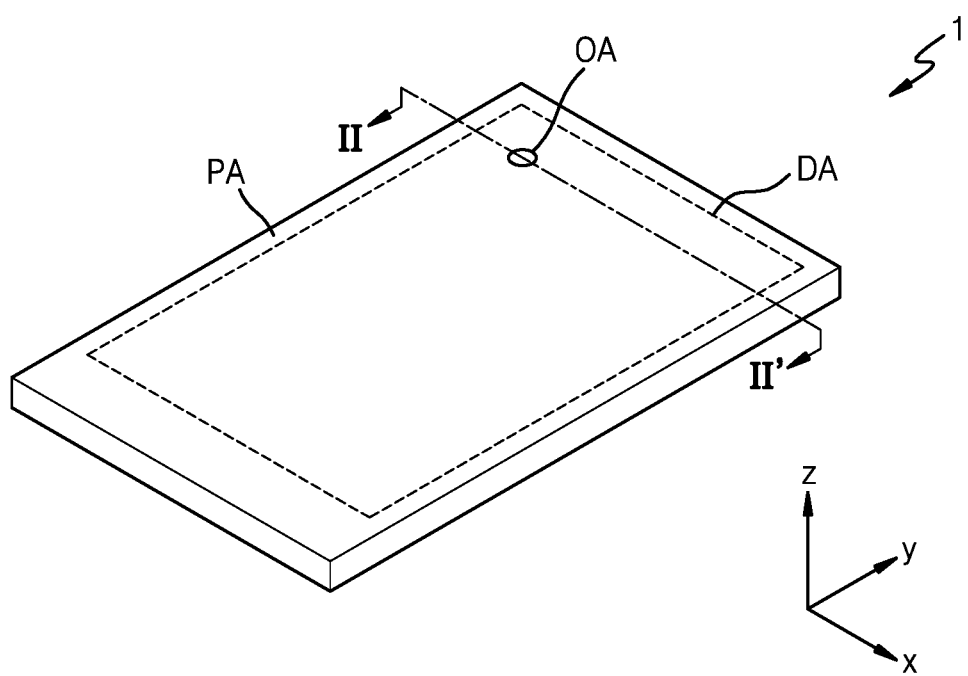
FIG. 1 is a perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Sizes of elements in the drawings may be exaggerated for convenience of explanation. In other words, since sizes and thicknesses of components in the drawings are arbitrarily illustrated for convenience of explanation, the following embodiments are not limited thereto.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When a certain embodiment may be implemented differently, a specific process order may be performed differently from the described order. For example, two consecutively described processes may be performed substantially at the same time or performed in an order opposite to the described order.

Hereinafter, embodiments of the invention will be described in detail with reference to the accompanying drawings.

FIG. 1 is a perspective view of a display device 1 according to an embodiment.

Figure 2:
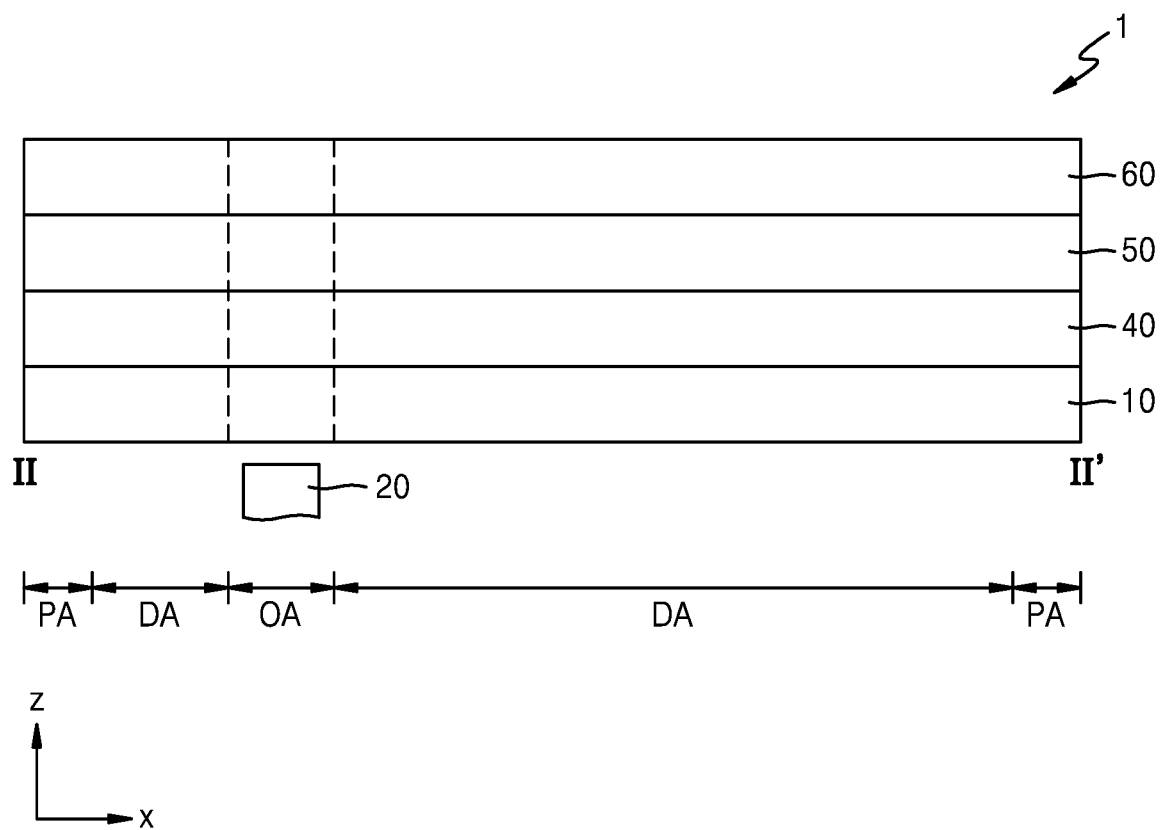
FIG. 2 is a cross-sectional view of the display device taken along line II-II' of FIG. 1.

Referring to FIG. 1, an embodiment of the display device 1 includes a transmission area OA and a display area DA surrounding the transmission area OA. The display device 1 may provide a predetermined image by using light emitted from a plurality of pixels arranged in the display area DA. In an embodiment, as shown in FIG. 1, a single transmission area OA is arranged inside the display area DA, and the transmission area OA may be surrounded by a plurality of pixels P (see FIG. 4) in the display area DA. The transmission area OA may be an area in which a component 20 described below with reference to FIG. 2 is arranged.

In an embodiment, as shown in FIG. 1, the display device 1 may have a rectangular shape having short sides in an x-direction and long sides in an y-direction. Herein, an z-direction may be a thickness direction of the display device 1.

Hereinafter, for convenience of description, embodiments where the display device 1 is s an organic light-emitting display device will be described in detail, but not being limited thereto. In an alternative embodiment, the display device 1 may be one of various types of display devices such as inorganic light-emitting displays and quantum dot light-emitting displays may be used. In one embodiment, for example, an emission layer of a display element provided to the display device 1 may include an organic material, include an inorganic material, include quantum dots, include an organic material and quantum dots, or include an inorganic material and quantum dots.

In an embodiment, as shown in FIG. 1, one transmission area OA is provided and is approximately circular, but the embodiment is not limited thereto. Alternatively, two or more transmission areas OA may be provided and the shape of each transmission area OA may be variously modified to another shape such as a circle, an ellipse, a polygon including a quadrangle, a star shape, or a diamond shape.

FIG. 2 is a cross-sectional view of the display device 1 taken along line II-II' of FIG. 1.

Referring to FIG. 2, the display device 1 may include a display panel 10, an input sensing layer 40, and an optical functional layer 50 arranged on the display panel 10. These elements may be covered by a window 60. The display device 1 may be one of various kinds of electronic devices such as mobile phones, laptop computers, and smartwatches.

The display panel 10 may display an image. The display panel 10 includes pixels arranged in the display area DA. Each of the pixels may include a display element and a pixel circuit connected to the display element. The display element may include an organic light-emitting diode or a quantum-dot organic light-emitting diode.

The input sensing layer 40 obtains coordinate information corresponding to an external input, for example, a touch event. The input sensing layer 40 includes a sensing electrode (or a touch electrode) and a trace line connected to the sensing electrode. The input sensing layer 40 may be arranged on the display panel 10. The input sensing layer 40 may sense an external input by using a mutual capacitance method and/or a self capacitance method.

The input sensing layer 40 may be provided or formed directly on the display panel 10 or be formed separately and then coupled to the display panel 10 by using an adhesive layer such as an optical clear adhesive. In one embodiment, for example, the input sensing layer 40 may be successively formed after a process of forming the display panel 10. In such an embodiment, the input sensing layer 40 may be a portion of the display panel 10, and an adhesive layer may not be provided between the input sensing layer 40 and the display panel 10. In an embodiment, as shown in FIG. 2, the input sensing layer 40 is arranged between the display panel 10 and the optical functional layer 50, but not being limited thereto. Alternatively, the input sensing layer 40 may be arranged on the optical functional layer 50.

The optical functional layer 50 may include a reflection prevention (or antireflection) layer. The reflection prevention layer may reduce reflectivity of light (external light) incident to the display panel 10 from the outside through the window 60. The reflection prevention layer may include a retarder and a polarizer. The retarder may include a film-type retarder or a liquid crystal-type retarder. The retarder may include a λ/2 retarder and/or a λ/4 retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film. The protective film of the retarder and the polarizer may be defined as a base layer of the reflection prevention layer.

In an alternative embodiment, the reflection prevention layer may include a black matrix and color filters. The color filters may be arranged by taking into account colors of pieces of light emitted respectively from the pixels of the display panel 10. Each of the color filters may include red, green, or blue pigment or dye. Alternatively, each of the color filters may further include quantum dots in addition to the pigment or the dye. Alternatively, some of the color filters may not include the pigment or the dye and may include scattering particles such as titanium oxide.

In another alternative embodiment, the reflection prevention layer may include a destructive interference structure. The destructive interference structure may include a first reflection layer and a second reflection layer respectively arranged on different layers. First-reflected light and second-reflected light respectively reflected by the first reflection layer and the second reflection layer may create destructive-interference and thus the reflectivity of external light may be reduced.

The optical functional layer 50 may include a lens layer. The lens layer may improve emission efficiency of light emitted from the display panel 10 or reduce color deviation. The lens layer may include a layer having a concave or convex lens shape and/or include a plurality of layers having different refractive indexes. The optical functional layer 50 may include both the reflection prevention layer and the lens layer, or include either the reflection prevention layer or the lens layer.

In an embodiment, the optical functional layer 50 may be successively formed after a process of forming the display panel 10 and/or the input sensing layer 40. In such an embodiment, an adhesive layer may not be arranged between the optical functional layer 50, the display panel, and/or the input sensing layer 40.

In an embodiment, as described above, the transmission area OA may be an area in which the component 20 is located, and the component 20 may provide at least one of various functions to the display device 1. In an embodiment, as shown in FIG. 2, the component 20 may be arranged below the display panel 10.

The component 20 may include an electronic element. In one embodiment, for example, the component 20 may be an electronic element that uses light or sound. In one embodiment, for example, an electronic element may be a sensor such as an infrared sensor that emits and/or receives light, a camera that receives light and captures an image, a sensor that outputs and senses light or sound to measure a distance or recognize a fingerprint, a small lamp that outputs light, or a speaker that outputs sound. An electronic element that uses light may use light in various wavelength bands such as visible light, infrared light, and ultraviolet light. In an embodiment, the transmission area OA may be an area through which light and/or sounds that are output from the component 20 to the outside or propagates toward the electronic element from the outside, may pass.

In an alternative embodiment, where the display device 1 is a smartwatch or an instrument panel for an automobile, the component 20 may be an elements such as clock hands or a needle indicating predetermined information (e.g. the velocity of a vehicle, etc.).

In an embodiment, as described above, the component 20 may include an element(s) related to a function of the display panel 10, or include an element such as an accessory that increases the aesthetic sense of the display panel 10. Though not shown in FIG. 2, an optical clear adhesive, etc. may be arranged between the window 60 and the optical functional layer 50.

Figure 3A:
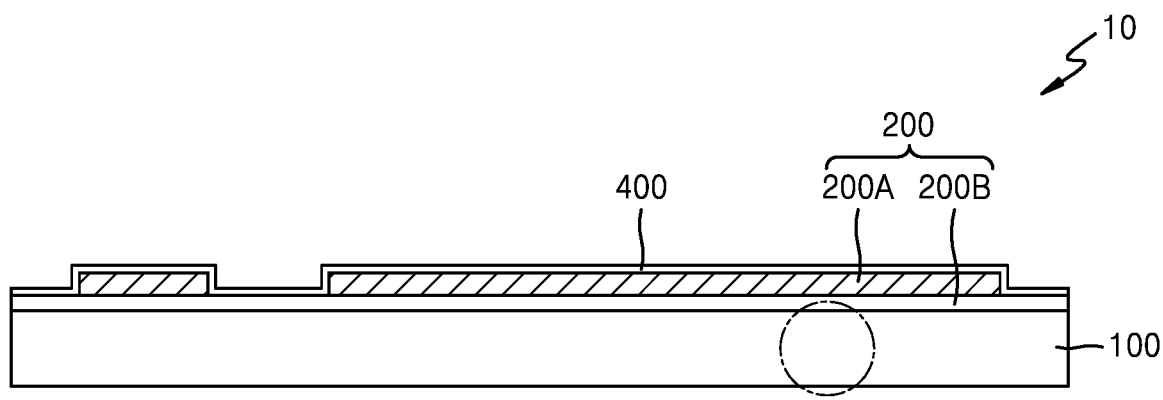
FIG. 3A is a cross-sectional view of a display panel shown in FIG. 2.
Figure 3B:
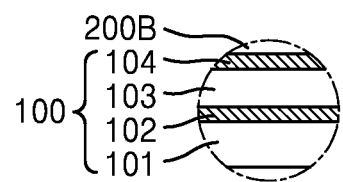
FIG. 3B is an enlarged view of the encircled portion of FIG. 3A.
Figure 3B:
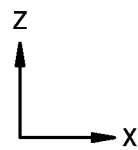

FIG. 3A is a cross-sectional view of the display panel 10 according to an embodiment, and FIG. 3B is an enlarged view of the encircled portion of FIG. 3A.

Referring to FIGS. 3A and 3B, an embodiment of the display panel 10 includes a display layer 200 arranged on a substrate 100. The substrate 100 may include a glass material or a polymer resin. The substrate 100 may include a multi-layer or have a multi-layer structure. In one embodiment, for example, as shown in FIG. 3B, the substrate 100 may include a first base layer 101, a first barrier layer 102, a second base layer 103, and a second barrier layer 104.

Each of the first and second base layers 101 and 103 may include a polymer resin. In one embodiment, for example, the first and second base layers 101 and 103 may include a polymer resin such as polyethersulfone ("PES"), polyarylate ("PAR"), polyetherimide ("PEI"), polyethylene naphthalate ("PEN"), polyethylene terephthalate ("PET"), polyphenylene sulfide ("PPS"), polyimide ("PI"), polycarbonate ("PC"), cellulose tri acetate ("TAC"), and cellulose acetate propionate ("CAP"). The first and second base layers 101 and 103 may include a transparent polymer resin.

The first and second barrier layers 102 and 104 are barrier layers for preventing the penetration of external foreign substances and may include a single layer or a multi-layer including an inorganic material such as silicon nitride and silicon oxide.

The display layer 200 includes a plurality of pixels. In an embodiment, the display layer 200 may include a display element layer 200A and a pixel circuit layer 200B. In such an embodiment, the display element layer 200A includes display elements arranged for each pixel, and the pixel circuit layer 200B includes a pixel circuit and insulating layers arranged for each pixel. Each pixel circuit may include a transistor and a storage capacitor, and each display element may include an organic light-emitting diode OLED.

The display elements of the display layer 200 may be covered by an encapsulation member such as a thin-film encapsulation layer 400. The thin-film encapsulation layer 400 may include at least one inorganic encapsulation layer and at least one organic encapsulation layer. In an embodiment where the display panel 10 includes the substrate 100 including a polymer resin, and the thin-film encapsulation layer 400 includes an inorganic encapsulation layer and an organic encapsulation layer, the flexibility of the display panel 10 may be improved.

Since the transmission area OA is not a hole that is defined completely through the display panel 10, a transparent organic layer 300 (see FIG. 6) is arranged at a position corresponding to the transmission area OA of the display layer 200, and the transparent organic layer includes a material having a high transmittance and is provided for not disturbing a communication function of the component 20 such as a camera. The transparent organic layer 300 will be described later in greater detail.

Figure 4:
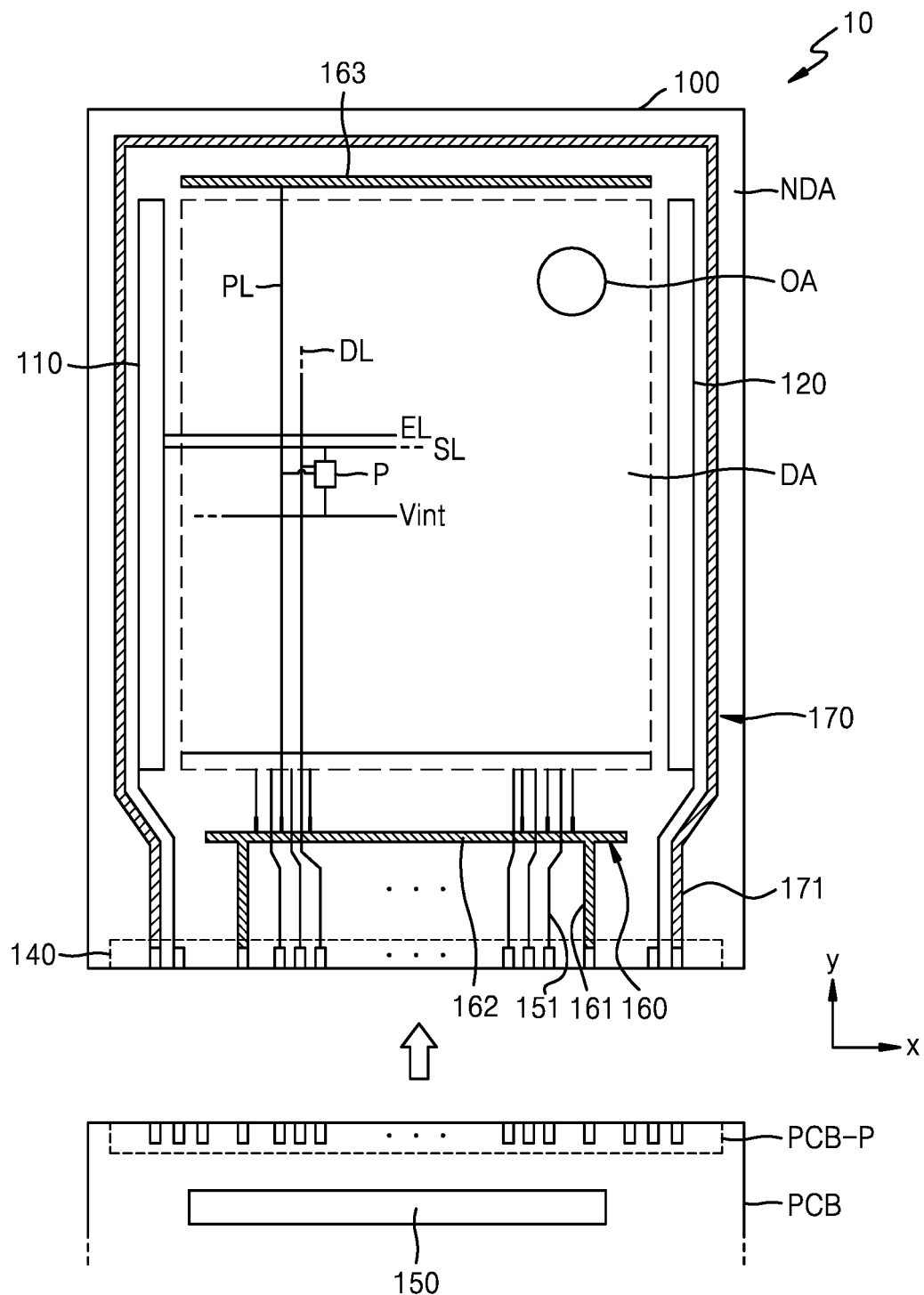
FIG. 4 is a plan view of a display panel shown in FIG. 3A.

FIG. 4 is a plan view of the display panel 10 according to an embodiment.

Referring to FIG. 4, an embodiment of the display panel 10 includes a plurality of pixels P arranged in the display area DA. Each of the pixels P may include a display element such as an organic light-emitting diode. Each pixel P may emit, for example, red, green, blue, or white light from an organic light-emitting diode. In an embodiment, as described above, a pixel P may be a pixel that emits light of red, green, blue, or white color, but not being limited thereto. The display area DA may be protected from external air or moisture, etc. by being covered by the thin-film encapsulation layer 400 as described above with reference to FIG. 3A.

The transmission area OA may be arranged inside the display area DA. A plurality of pixels P are arranged around the transmission area OA. The transmission area OA may be formed at a position close to one side of an upper end of the display area DA as shown in FIG. 1 or 4, or may be formed at a center. The plurality of pixels P may surround the transmission area OA.

Each pixel P is electrically connected to outer circuits arranged in a non-display area NDA corresponding to a peripheral area PA of FIG. 1. In an embodiment, a first scan driving circuit 110, a second scan driving circuit 120, a terminal 140, a data driving circuit 150, a first power supply line 160, and a second power supply line 170 may be arranged in the non-display area NDA.

The first scan driving circuit 110 may provide a scan signal to each pixel P through a scan line SL. The first scan driving circuit 110 may provide an emission control signal to each pixel P through an emission control line EL. The second scan driving circuit 120 may be arranged in parallel to the first scan driving circuit 110 with the display area DA therebetween. Some of the pixels P arranged in the display area DA may be electrically connected to the first scan driving circuit 110, and the rest of the pixels P may be connected to the second scan driving circuit 120.

The terminal 140 may be arranged on one side or an end portion of the substrate 100. The terminal 140 may be exposed and electrically connected to a printed circuit board PCB by not being covered by an insulating layer. A terminal PCB-P of the printed circuit board PCB may be electrically connected to the terminal 140 of the display panel 10. The printed circuit board PCB is configured to transfer a signal of a controller (not shown) or power to the display panel 10. Control signals generated by the controller may be respectively transferred to the first and second scan driving circuits 110 and 120 through the printed circuit board PCB. The controller may respectively provide first and second power voltages ELVDD and ELVSS (see FIG. 5 described below) to the first and second power supply lines 160 and 170 through first and second connection lines 161 and 171. The first power voltage ELVDD may be provided to each pixel P through a driving voltage line PL connected to the first power supply line 160, and the second power voltage ELVSS may be provided to an opposite electrode (not shown) of a pixel P connected to the second power supply line 170.

The data driving circuit 150 may be electrically connected to a data line DL. A data signal of the data driving circuit 150 may be provided to each pixel P through a connection line 151 and the data line DL, the connection line 151 is connected to the terminal 140, and the data line DL is connected to the connection line 151. In an embodiment, as shown in FIG. 4, the data driving circuit 150 is arranged on the printed circuit board PCB, but not being limited thereto. Alternatively, the data driving circuit 150 may be arranged on the substrate 100. In one embodiment, for example, the data driving circuit 150 may be arranged between the terminal 140 and the first power supply line 160 on the substrate 100.

The first power supply line 160 may include a first sub-line 162 and a second sub-line 163 that are parallel to each other with the display area DA therebetween and extending in the x-direction. The second power supply line 170 may have a loop shape having one open side and partially surround the display area DA.

Figure 5:
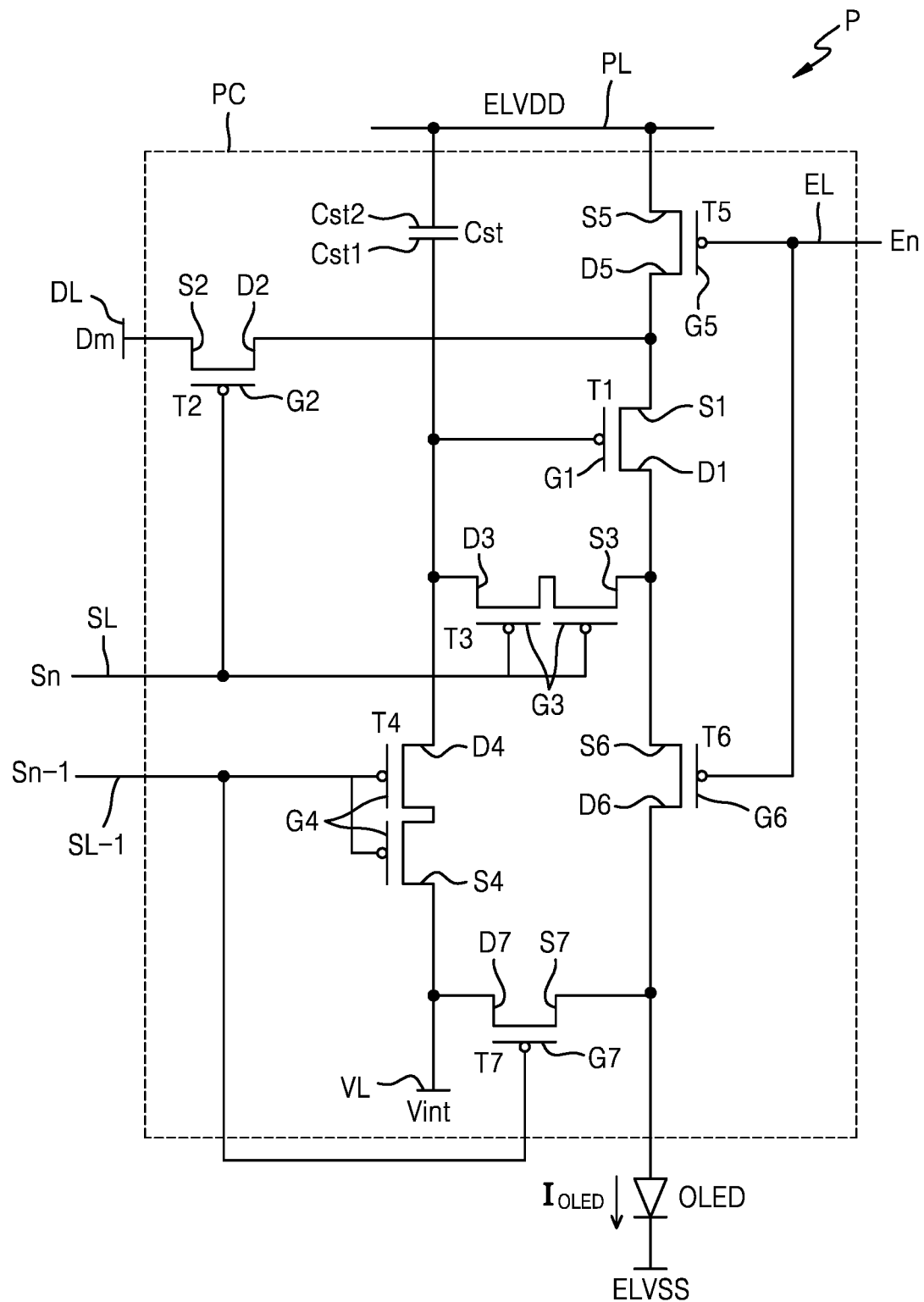
FIG. 5 is an equivalent circuit diagram of a pixel shown in FIG. 4.

FIG. 5 is an equivalent circuit diagram of a pixel P of the display panel 10 according to an embodiment.

Referring to FIG. 5, an embodiment of each pixel P includes the pixel circuit PC and the organic light-emitting diode OLED connected to the pixel circuit PC. The pixel circuit PC may include a plurality of thin film transistors and a storage capacitor. The thin film transistors and the storage capacitor may be connected to signal lines SL, SL-1, EL, and DL, an initialization voltage line VL, and the driving voltage line PL.

In an embodiment, as shown in FIG. 5, a pixel P is connected to the signal lines SL, SL-1, EL, and DL, the initialization voltage line VL, and the driving voltage line PL, but not being limited thereto. In an alternative embodiment, at least one of the signal lines SL, SL-1, EL, and DL, the initialization voltage line VL, and the driving voltage line PL may be shared by pixels that neighbor each other.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines include the scan line SL, the previous scan line SL-1, the emission control line EL, and the data line DL. In an embodiment, the scan line SL is configured to transfer a scan signal Sn, the previous scan line SL-1 is configured to transfer a previous scan signal Sn-1 to a first initialization thin film transistor T4 and a second initialization thin film transistor T7, the emission control line EL is configured to transfer an emission control signal En to an operation control thin film transistor T5 and an emission control thin film transistor T6, and the data line DL intersects with the scan line SL and is configured to transfer a data signal Dm. The driving voltage line PL is configured to transfer the driving voltage ELVDD to the driving thin film transistor T1, and the initialization voltage line VL is configured to transfer an initialization voltage Vint for initializing the driving thin film transistor T1 and a pixel electrode of the organic light-emitting diode OLED.

A driving gate electrode G1 of the driving thin film transistor T1 is connected to a first storage capacitor plate Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to the pixel electrode of the organic light-emitting diode OLED through the emission control thin film transistor T6. The driving thin film transistor T1 is configured to receive a data signal Dm based on a switching operation of a switching thin film transistor T2 and supplies a driving current $I_{OLED}$ to the organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and simultaneously connected to the driving voltage line PL through the operation control thin film transistor T5. The switching thin film transistor T2 is turned on in response to a scan signal Sn transferred through the scan line SL and is configured to perform a switching operation of transferring a data signal Dm transferred through the data line DL to the driving source electrode S1 of the driving thin film transistor T1.

A compensation gate electrode G3 of a compensation thin film transistor T3 is connected to the scan line SL, a compensation source electrode S3 of the compensation thin film transistor T3 is connected to the driving drain electrode D1 of the driving thin film transistor T1 and simultaneously connected to the pixel electrode of the organic light-emitting diode OLED through the emission control thin film transistor T6, and a compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal Sn transferred through the scan line SL and is configured to diode-connect the driving thin film transistor T1 by electrically connecting the driving gate electrode G1 to the driving drain electrode D1 of the driving thin film transistor T1.

A first initialization gate electrode G4 of the first initialization thin film transistor T4 is connected to the previous scan line SL-1, a first initialization source electrode S4 of the first initialization thin film transistor T4 is connected to a second initialization drain electrode D7 of the second initialization thin film transistor T7 and the initialization voltage line VL, and a first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn-1 transferred through the previous scan line SL-1 and is configured to perform an initialization operation of initializing a voltage of the driving gate electrode G1 of the driving thin film transistor T1 by transferring the initialization voltage to the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is connected to the second initialization source electrode S7 of the second initialization thin film transistor T7 and the pixel electrode of the organic light-emitting diode OLED.

The operation control thin film transistor T5 and the emission control thin film transistor T6 are simultaneously turned on in response to an emission control signal En transferred through the emission control line EL to allow the driving voltage ELVDD to be transferred to the organic light-emitting diode OLED and thus the driving current $I_{OLED}$ to flow through the organic light-emitting diode OLED.

A second initialization gate electrode G7 of the second initialization thin film transistor T7 is connected to the previous scan line SL-1, the second initialization source electrode S7 of the second initialization thin film transistor T7 is connected to the emission control drain electrode D6 of the emission control thin film transistor T6 and the pixel electrode of the organic light-emitting diode OLED, and the second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to a previous scan signal Sn-1 transferred through the previous scan line SL-1 and is configured to initialize the pixel electrode of the organic light-emitting diode OLED.

FIG. 5 shows an embodiment where the first initialization thin film transistor T4 and the second initialization thin film transistor T7 are connected to the previous scan line SL-1, but not being limited thereto. In an alternative embodiment, the first initialization thin film transistor T4 may be connected to the previous scan line SL-1 and driven in response to a previous scan signal Sn-1, and the second initialization thin film transistor T7 may be connected to a separate signal line (for example, the next scan line) and driven in response to a signal transferred through the separate signal line.

A second storage capacitor plate Cst2 of the storage capacitor Cst is connected to the driving voltage line PL, and an opposite electrode of the organic light-emitting diode OLED is connected to the common voltage ELVSS. Therefore, the organic light-emitting diode OLED may be configured to receive the driving current $I_{OLED}$ from the driving thin film transistor T1 and emit light to thereby display an image.

In an embodiment, as shown in FIG. 5, the compensation thin film transistor T3 and the first initialization thin film transistor T4 each have a dual gate electrode, but not being limited thereto. Alternatively, the compensation thin film transistor T3 and the first initialization thin film transistor T4 each may have a single gate electrode.

Figure 6:
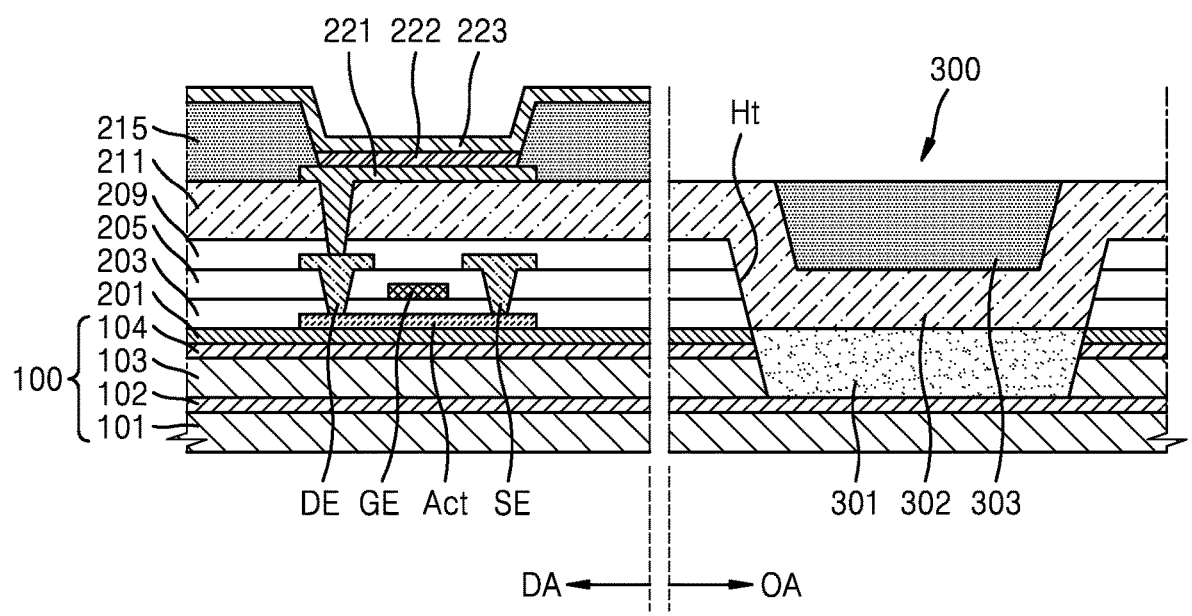
FIG. 6 is a cross-sectional view of a cross-sectional structure of a transmission area and a display area in the display device shown in FIG. 1.

Hereinafter, a structure of the transmission area OA will be described with reference to FIG. 6. FIG. 6 is a cross-sectional view of the transmission area OA and a pixel P inside the display area DA according to an embodiment.

In an embodiment, a plurality of pixels P are arranged around the transmission area OA. In such an embodiment, as described above, the transmission area OA is defined in the display area DA and thus is surrounded by the plurality of pixels.

Since transmission/reception of a signal of the component 20 such as a camera is performed in the transmission area OA, a groove Ht is formed by dry-etching insulating layers of the display area DA to increase a transmittance of the transmission area OA. When the groove Ht is left empty, a transmittance of the groove Ht may be improved, but when patterning other conductive layers, residues that are not removed in the groove Ht may remain, which may reduce the transmittance and cause various noises. Therefore, in an embodiment, the groove Ht is filled with the transparent organic layer 300 including Si, O, or C-based siloxane having a high transmittance, such that a high transmittance may be maintained by effectively preventing transmittance decrease and noises by residues.

First, a cross-sectional stacked structure of a pixel P will be described with reference to the display area DA on the left side of FIG. 6.

Referring to the display area DA of FIG. 6, the substrate 100 may include a glass material or a polymer resin. In an embodiment, the substrate 100 may include a plurality of sub-layers as shown above in FIG. 3B. In such an embodiment, the substrate 100 includes the first base layer 101, the first barrier layer 102, the second base layer 103, and the second barrier layer 104.

A buffer layer 201 may be disposed on the substrate 100 to prevent impurities from penetrating into a semiconductor layer Act of a thin film transistor. The buffer layer 201 may include an inorganic insulating material such as silicon nitride, silicon oxynitride, and silicon oxide and include a single layer or a multi-layer including the inorganic insulating materials.

A pixel circuit such as a thin film transistor may be arranged on the buffer layer 201. The thin film transistor may include the semiconductor layer Act, a gate electrode GE, a source electrode SE, and a drain electrode DE. The thin film transistor shown in FIG. 6 may correspond to the driving thin film transistor described with reference to FIG. 5. In an embodiment, as shown in FIG. 6, the thin film transistor may be a top gate-type thin film transistor in which the gate electrode GE is arranged over the semiconductor layer Act with a gate insulating layer 203 therebetween, but not being limited thereto. Alternatively, thin film transistor may be a bottom gate-type thin film transistor.

The semiconductor layer Act may include polycrystalline silicon. Alternatively, the semiconductor layer Act may include amorphous silicon, an oxide semiconductor, or an organic semiconductor. The gate electrode GE may include a low resistance-metal material. The gate electrode GE may include at least one material selected from molybdenum (Mo), aluminum (Al), copper (Cu) and titanium (Ti), and have a single layer structure or a multi-layer structure, where each layer includes at least one material selected from the above materials.

The semiconductor layer Act and the gate electrode GE may include an inorganic insulating material such as silicon oxide, silicon nitride, silicon oxynitride, aluminum oxide, titanium oxide, tantalum oxide, and hafnium oxide. The gate insulating layer 203 may have a single layer structure or a multi-layer structure, where each layer includes at least one material selected from the above materials.

The source electrode SE and the drain electrode DE may include a material having high conductivity. The source electrode SE and the drain electrode DE may include a conductive material including molybdenum (Mo), aluminum (Al), copper (Cu) or titanium (Ti), and has a single layer structure or a multi-layer structure, where each layer includes at least one material selected from the above materials. In an embodiment, the source electrode SE, the drain electrode DE and the data line DL may have a multi-layer structure of Ti/Al/Ti.

An interlayer insulating layer 205 may include an inorganic insulating material such as silicon oxide, silicon nitride, silicon oxynitride, aluminum oxide, titanium oxide, tantalum oxide and hafnium oxide, and have a single layer structure or a multi-layer structure, where each layer includes at least one material selected from the above materials.

The pixel circuit including the thin film transistor may be covered by a first organic insulating layer 209. The first organic insulating layer 209 may include an approximately flat top surface.

The drain electrode DE of the thin film transistor may be electrically connected to a pixel electrode 221. The pixel electrode 221 may be connected to the drain electrode DE through a contact hole defined in the first and second organic insulating layers 209 and 211.

The first organic insulating layer 209 may include a general-purpose polymer such as polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a combination (e.g., a blend) thereof. In an embodiment, the first organic insulating layer 209 and the second organic insulating layer 211 may include PI.

The second organic insulating layer 211 may include siloxane. Though described below again, a central siloxane layer 302 of the transparent organic layer 300 is arranged on a same layer as a layer on which the second organic insulating layer 211 is arranged, the central siloxane layer 302 may be disposed in the groove Ht of the transmission area OA, or the groove Ht of the transmission area OA is filled with the central siloxane layer 302.

The pixel electrode 221 may be disposed on the second organic insulating layer 211. The pixel electrode 221 may include a conductive oxide such as indium tin oxide ("ITO"), zinc oxide ("IZO"), zinc oxide (ZnO), indium oxide ($In_2O_3$), indium gallium oxide ("IGO"), and aluminum zinc oxide ("AZO"). In an alternative embodiment, the pixel electrode 221 may include a reflective layer including at least one material selected from silver (Ag), magnesium (Mg), aluminum (Al), platinum (Pt), palladium (Pd), gold (Au), nickel (Ni), neodymium (Nd), iridium (Ir), chrome (Cr) and a combination (e.g., a compound) thereof. In another alternative embodiment, the pixel electrode 221 may further include a layer including ITO, IZO, ZnO, or $In_2O_3$ on/under the reflective layer.

A pixel-defining layer 215 may be disposed on the pixel electrode 221. An opening is defined through the pixel-defining layer 215 to expose a top surface of the pixel electrode 221 and cover edges of the pixel electrode 221. The pixel-defining layer 215 may include siloxane. A top siloxane layer 303 of the transparent organic layer 300 is arranged on a same layer as a layer on which the pixel-defining layer 215 is arranged, and the top siloxane layer 303 may be disposed in the groove Ht of the transmission area OA, or the groove Ht of the transmission area OA is filled with the siloxane layer 303.

An emission layer 222 may include a polymer organic material or a low molecular weight organic material that emits light having a predetermined color. An electron transport layer ("ETL") and a hole transport layer ("HTL") may be respectively arranged on and under the emission layer 222.

The emission layer 222 is arranged for each pixel in the display area DA and patterned to correspond to the pixel electrode 221. In an embodiment, the pixel-defining layer 215 surrounds the pixel electrode 221 while covering the edges of the pixel electrode 221. The emission layer 222 is arranged inside an emission region of each pixel surrounded by the pixel-defining layer 215.

An opposite electrode 223 may include a conductive material having a low work function. In one embodiment, for example, the opposite electrode 223 may include a (semi)-transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or a combination (e.g., an alloy) thereof. Alternatively, the opposite electrode 223 may further include a layer including ITO, IZO, ZnO, or $In_2O_3$ on/under the (semi)-transparent layer including the above materials. The opposite electrode 223 may be arranged on an intermediate area MA as well as the display area DA. The opposite electrode 223 may be formed by a thermal deposition.

The thin-film encapsulation layer 400 described above with reference to FIG. 3A covers the opposite electrode 223. The thin-film encapsulation layer 400 may have a structure in which an inorganic encapsulation layer and an organic encapsulation layer are alternately stacked one on another.

The inorganic encapsulation layer may include at least one inorganic material selected from aluminum oxide, titanium oxide, tantalum oxide, hafnium oxide, zinc oxide, silicon oxide, silicon nitride, and silicon oxynitride. The organic encapsulation layer may include a polymer-based material. The polymer-based material may include an acryl-based resin, an epoxy-based resin, PI, or polyethylene.

If the insulating layers 201, 203, 205, and 209 in the display area DA are stacked in the transmission area OA of the substrate 100, a transmittance of the transmission area OA may be reduced. Therefore, in an embodiment, the groove Ht is formed by removing portions of the insulating layers 201, 203, 205, and 209 in the transmission area OA such that the signal exchange of the component 20 is not disturbed. In such an embodiment, the groove Ht is formed by removing not only the insulating layers 201, 203, 205, and 209 but also the second barrier layer 104 and the second base layer 103 of the substrate 100. Since the transmittance in the transmission area OA is improved by reducing the number of stacked layers, the groove Ht is formed up to a portion of a sub-layer of the substrate 100. However, since at least one base layer and one barrier layer is desired be left to prevent moisture penetration through the transmission area OA from the outside, no portion of the first barrier layer 102 and the first base layer 101 is removed.

In an embodiment, if the groove Ht is left as it is, as described above, residues may remain during patterning that uses a photoresist, which may cause issues such as transmittance reduction and noise generation. Therefore, in an embodiment, the groove Ht is filled with the transparent organic layer 300 including siloxane having a transmittance of almost about 98%.

The transparent organic layer 300 may have a three-layered structure of a bottom siloxane layer 301, the central siloxane layer 302, and the top siloxane layer 303, where each of the layers 301, 302 and 303 include siloxane.

The bottom siloxane layer 301 is arranged on a bottom surface of the groove Ht and a depth of the groove Ht corresponding to layers from the second base layer 103 to the buffer layer 201 is filled with the bottom siloxane layer 301.

The central siloxane layer 302 is arranged on the bottom siloxane layer 301 and arranged in a same layer as a layer in which the second organic insulating layer 211 is arranged.

The top siloxane layer 303 is arranged on the central siloxane layer 302 to fill a step difference caused by the groove Ht and provide a flat surface. The top siloxane layer 303 is arranged in a same layer as a layer in which the pixel-defining layer 215 is arranged.

In an embodiment, as described above, the groove Ht is formed by excavating the insulating layers having a relatively low transmittance in the transmission area OA, and filled with the transparent organic layer 300 including siloxane having a high transmittance. Therefore, a structure of the transmission area OA in which the signal exchange of the component 20 is smooth and residue issue may be resolved may be implemented.

The display device including the transmission area OA may be formed by a process shown in FIGS. 7A to 7E. FIGS. 7A to 7E are cross-sectional views sequentially showing a process of manufacturing the display device shown in FIG. 6.

Figure 7A:
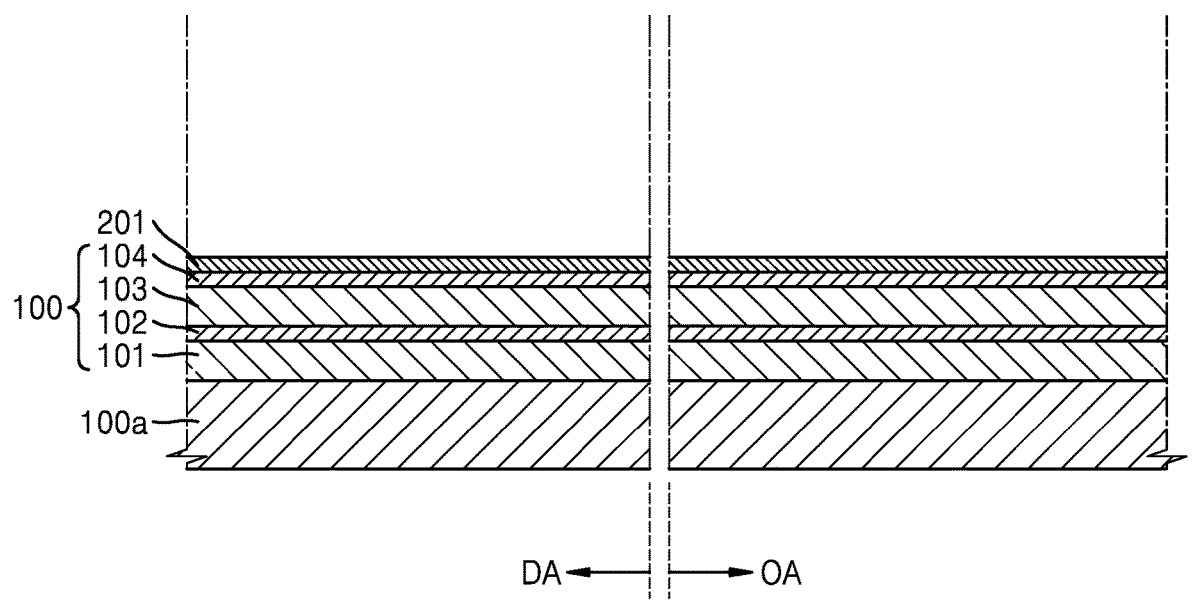
FIGS. 7A to 7E are cross-sectional views sequentially showing a process of manufacturing the display device shown in FIG. 6.

In an embodiment, as shown in FIG. 7A, the first base layer 101, the first barrier layer 102, the second base layer 103, the second barrier layer 104, and the buffer layer 201 are sequentially provided or formed on a glass plate 100a. The glass plate 100a is a type of carrier substrate used in the manufacturing process and is removed from a final product.

Figure 7B:
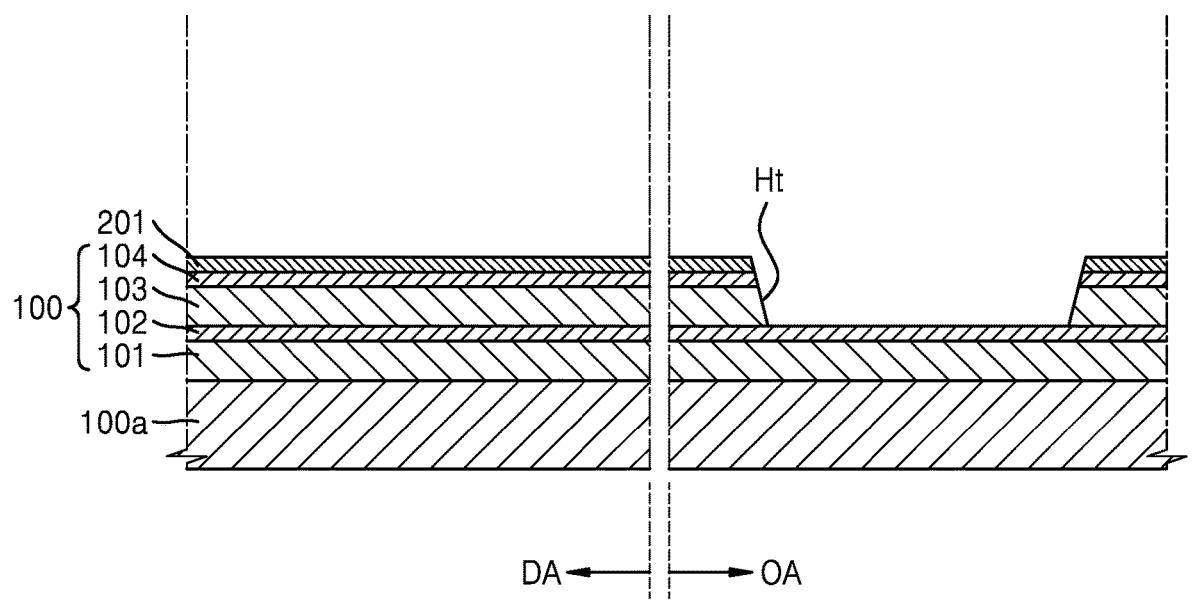

Subsequently, as shown in FIG. 7B, the groove Ht is formed by removing portions of layers from the buffer layer 201 to the second base layer 103 in the transmission area OA. The groove Ht may be formed by, for example, patterning and dry etching that use a photoresist.

Figure 7C:
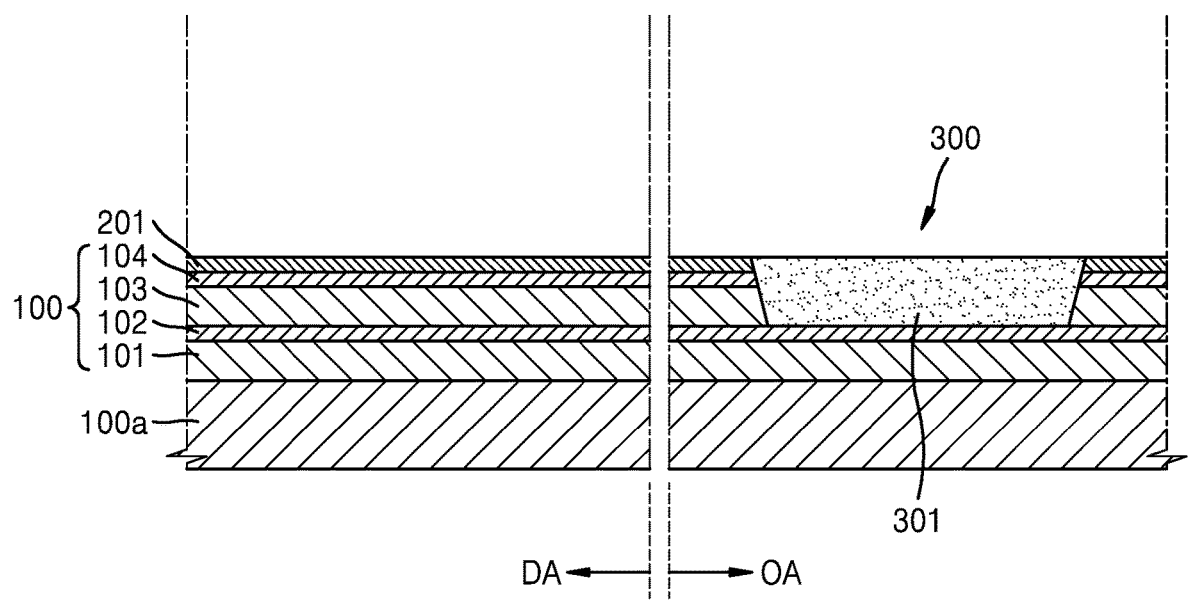

In an embodiment, as shown in FIG. 7C, the bottom siloxane layer 301 is provided in the groove Ht to be filled therewith. In a comparative example, since the step difference due to the groove Ht occurs, residues may remain in the groove Ht, when the semiconductor layer Act, the gate electrode GE, the source electrode SE, the drain electrode DE, etc. are patterned, due to the step difference. Such features will hereinafter be described.

If the groove Ht is left empty without the bottom siloxane layer 301, the photoresist coated for the patterning may be formed relatively thick in the groove Ht. When forming the semiconductor layer Act, for example, the semiconductor layer Act is formed on an entire surface of the buffer layer 201, and the photoresist is coated thereon and patterned in a desired shape. In this case, the photoresist is coated thicker in the groove Ht than the surrounding portions due to the step difference. In this state, when patterning is performed in accordance with a normal thickness of the photoresist, the photoresist is not completely removed and remains in the groove Ht. Accordingly, the semiconductor layer Act under the residual photoresist may not be effectively removed and remains. In this way, the photoresist is formed thicker in the groove Ht than the surroundings, and the same phenomenon may be repeated when patterning not only the semiconductor layer Act but also the gate electrode GE, the source electrode SE, the drain electrode DE, etc. In this case, residues of the conductive layers and the photoresist that are not removed may remain in the transmission area OA that is desired to have a high transmittance, such that the transmittance may be decreased and various noise signals may be caused by the remaining conductive layers in the transmission area OA.

In an embodiment, the groove Ht is filled with the transparent organic layer 300 including siloxane having a high transmittance fills, such that the issue of residue generation during the patterning may be resolved and a high transmittance may be maintained.

Figure 7D:
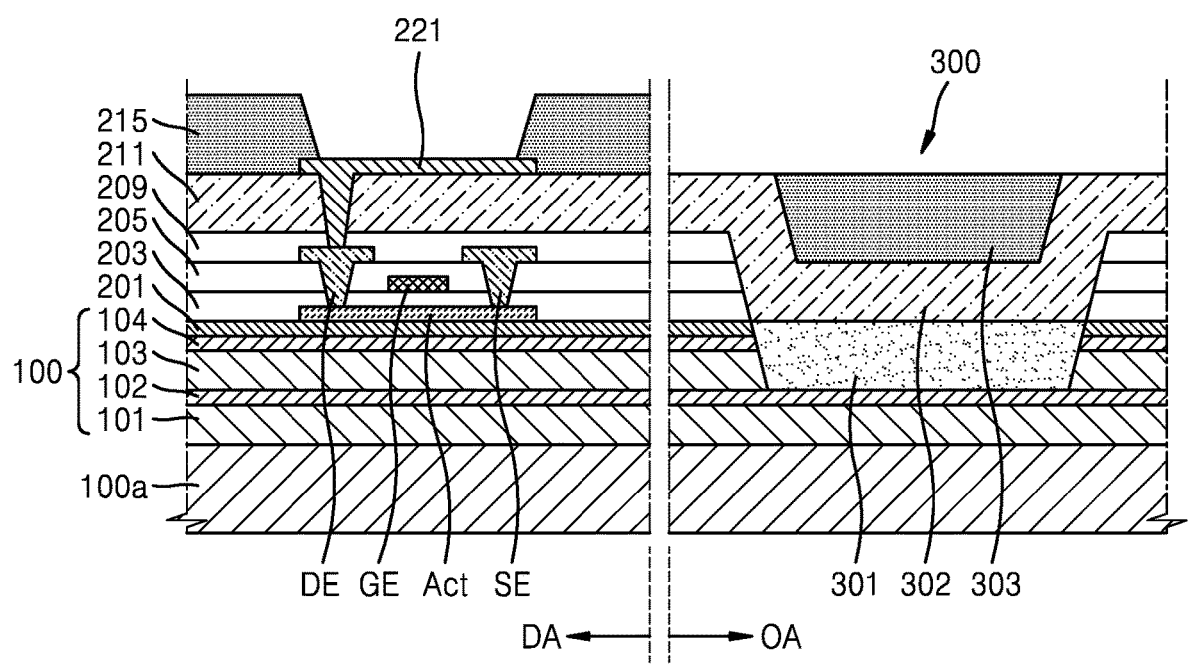

In an embodiment, as shown in FIG. 7D, when the patterning is performed while stacking the conductive layer and the insulating layers from the semiconductor layer Act to the pixel-defining layer 215, the issue of the residue caused by the severe step difference of the groove Ht may be effectively prevented. In such an embodiment, since the insulating layers from the gate insulating layer 203 to the first organic insulating layer 209 are continuously stacked on the bottom siloxane layer 301 by a subsequent process, the insulating layers stacked on the bottom siloxane layer 301 are removed again such that the groove Ht is continuously defined therethrough, and the central siloxane layer 302 and the top siloxane layer 303 are additionally stacked on the bottom siloxane layer 301 in the groove Ht. Therefore, the step difference of the transmission area OA is prevented from being large even in the subsequent process. In such an embodiment, while the second organic insulating layer 211 is formed, the central siloxane layer 302 is formed in a same layer as a layer in which the second organic insulating layer 211 is formed, and while the pixel-defining layer 215 is formed, the top siloxane layer 303 is formed in a same layer as a layer in which the pixel-defining layer 215 is formed. In such an embodiment, since the groove Ht in the transmission area OA is filled with the transparent organic layer 300 while various kinds of insulating layers and conductive layers are stacked, the issue of residues caused by the step difference may be effectively prevented.

Figure 7E:
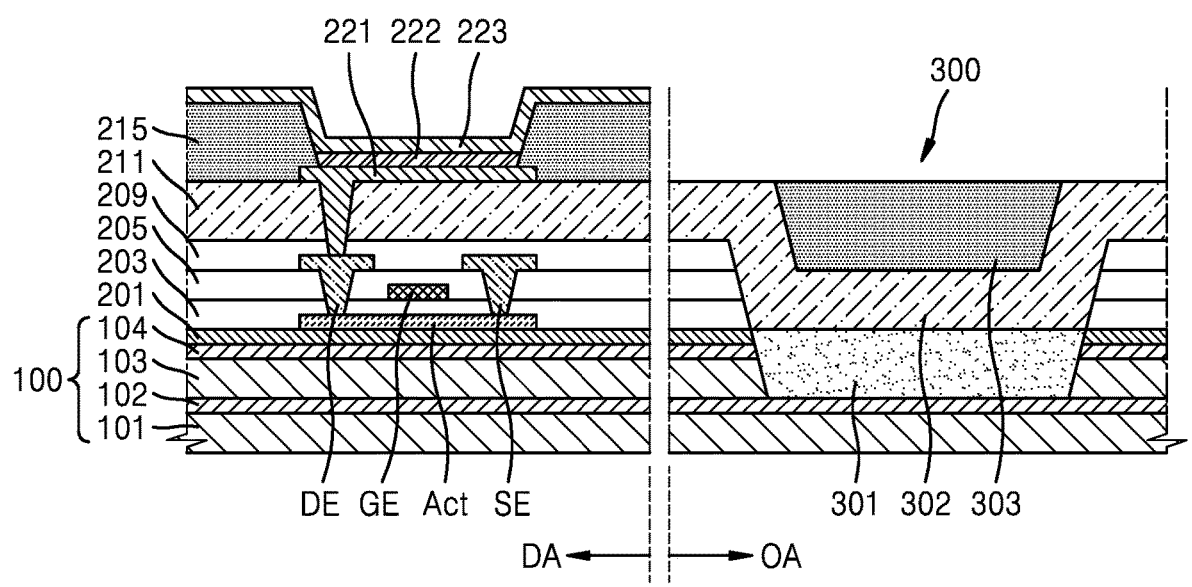

Then, when the emission layer 222 and the opposite electrode 223 are formed, the display device shown in FIG. 7E is manufactured.

Therefore, according to an embodiment of the invention, the undesired formation of residues may be effectively prevented and a high transmittance may be maintained by filling the groove Ht with the transparent organic layer 300 including siloxane having a high transmittance.

Various modifications may be made from the above embodiment. A modified structure thereof will hereinafter described in detail.

Figure 8:
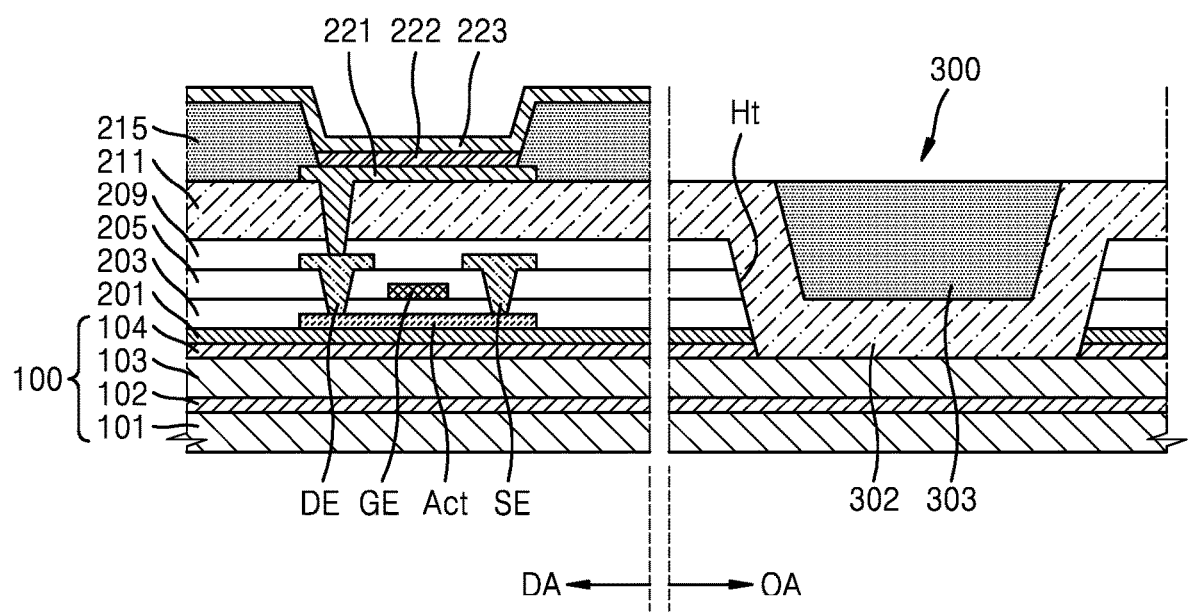
FIG. 8 is a cross-sectional view of an alternative embodiment in which the number of stacked transparent organic layers in the display device shown in FIG. 6 is modified.
Figure 9A:
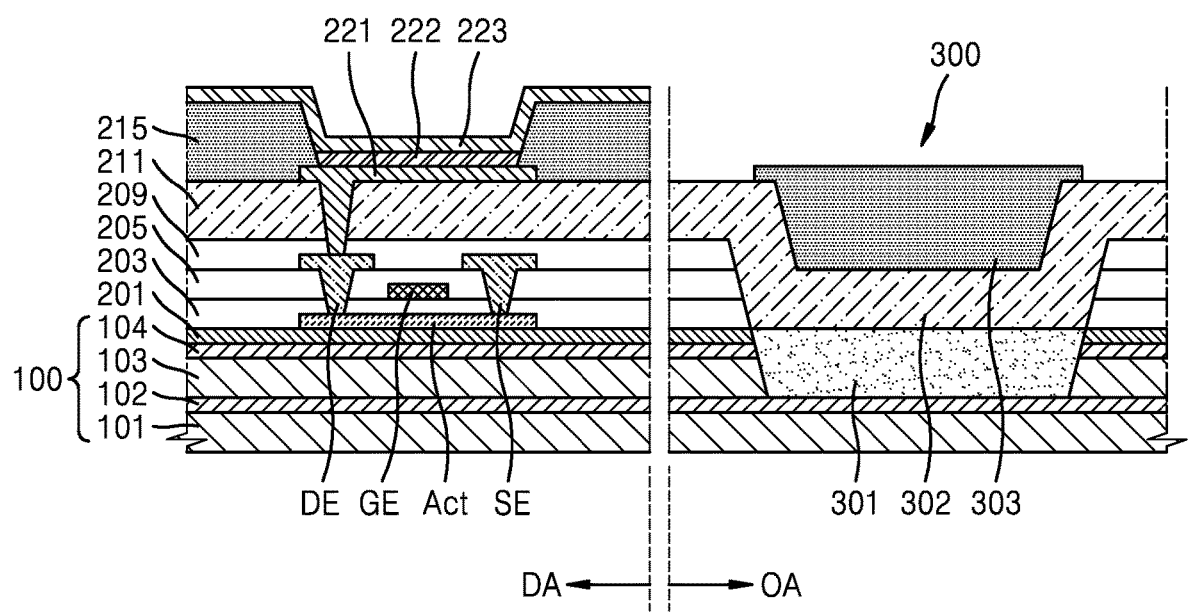
FIGS. 9A to 9C are cross-sectional views of an alternative embodiment in which a shape of a transparent organic layer in the display device shown in FIG. 6 is modified.
Figure 9B:
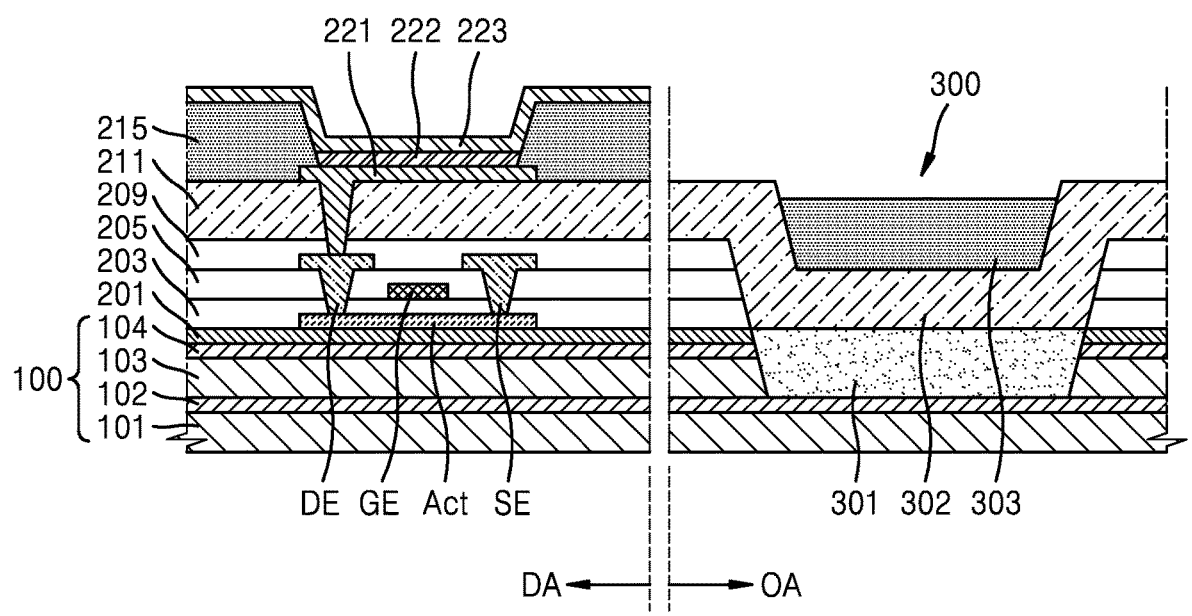
Figure 9C:
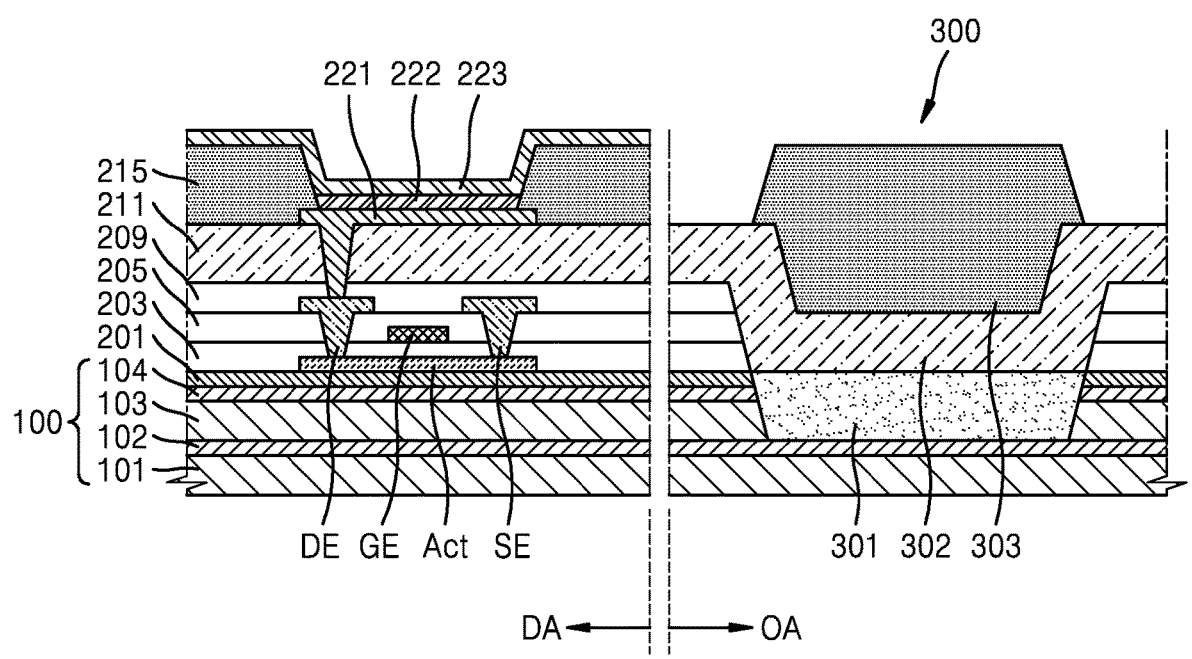

FIG. 8 is a cross-sectional view of an alternative embodiment in which the number of stacked transparent organic layers in the display device shown in FIG. 6 is modified, and FIGS. 9A to 9C are cross-sectional views of an alternative embodiment in which a shape of a transparent organic layer in the display device shown in FIG. 6 is modified.

In an embodiment, as described above, the structure in which the transparent organic layer 300 includes three layers including the bottom siloxane layer 301, the central siloxane layer 302, and the top siloxane layer 303. In an alternative embodiment, as shown in FIG. 8, the transparent organic layer 300 may include two layers including the central siloxane layer 302 and the top siloxane layer 303. In such an embodiment, the bottom siloxane layer 301 is omitted and the groove Ht is filled with layers starting from the central siloxane layer 302. In such an embodiment, the first base layer 101 to the first organic insulating layer 209 are formed, and then the groove Ht is formed in the transmission area OA, and the second organic insulating layer 211 and the central siloxane layer 302 are formed thereon, such that the central siloxane layer 302 is arranged in a same layer as a layer in which the second organic insulating layer 211 is arranged, In such an embodiment, the top siloxane layer 303 is formed while the pixel-defining layer 215 is formed, such that the top siloxane layer 303 is arranged in a same layer as a layer in which the pixel-defining layer 215 is arranged.

In an embodiment, as described above, the groove Ht is formed up to the second barrier layer 104 and the second base layer 103. In an alternative embodiment, the groove Ht may be formed only up to the second barrier layer 104 as shown in FIG. 8. In such an embodiment, the groove Ht is not formed in the first base layer 101 and the first barrier layer 102 to prevent external moisture transmission. In such an embodiment, b the groove Ht may be formed selectively up to the second base layer 103 or the second barrier layer 104. In such an embodiment, since the bottom siloxane layer 301 is omitted and instead, the second base layer 103 is left as it is without forming the groove Ht therethrough, the step difference of the groove Ht is prevented from being severe while the central siloxane layer 302 is formed. In such an embodiment, as described above, the number of layers constituting the transparent organic layer 300, the depth of the groove Ht, etc. may be variously modified.

In an embodiment, as shown in FIGS. 6 and 8, an uppermost surface of the central siloxane layer 302 and an uppermost surface of the top siloxane layer 303 are arranged on a same plane. In an alternative embodiment, the central siloxane layer 302 and the top siloxane layer 303 may be configured to have relatively different heights. Herein, the term "height" of a layer may mean a distance of an uppermost surface thereof with respect to the first base layer 101.

In an embodiment, as shown in FIG. 9A, the uppermost surface of the top siloxane layer 303 may protrude higher than the uppermost surface of the central siloxane layer 302. In an alternative embodiment, as shown in FIG. 9B, the uppermost surface of the central siloxane layer 302 may protrude higher than the uppermost surface of the top siloxane layer 303.

In an embodiment, since the top siloxane layer 303 is formed in a same layer as a layer in which the pixel-defining layer 215 is formed, as shown in FIG. 9C, the top siloxane layer 303 may be configured to protrude to a height substantially equal to the height of the uppermost surface of the pixel-defining layer 215. In an embodiment, as described above, based on the arrangement of the transparent organic layer 300 including siloxane in the transmission area OA, the number of layers, the depth, or the protruding shape of the transparent organic layer 300 may be variously designed or modified.

According to embodiments of the display device described set forth herein, since the transparent organic layer including siloxane is disposed in the groove in the transmission area corresponding to the component such as a camera, reduction of the transmittance may be effectively prevented. In such embodiments, the issue by residues that are not removed and remain inside the groove during a patterning process may be resolved.

Therefore, the display device in which a stable function of the component is maintained and a wide display area is secured may be provided. However, the invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claimss.

What is claimed is:

1. A method of manufacturing a display device, the method comprising:
    forming a substrate, the substrate including a first base layer, a first barrier layer, a second base layer, and a second barrier layer, which are sequentially stacked one on another;
    forming a first groove by either removing portions of the second base layer and the second barrier layer, or removing a portion of the second barrier layer;
    filling the first groove with a first siloxane layer comprising siloxane;
    forming a plurality of display elements arranged over the substrate and not overlapping the first groove;
    forming a pixel circuit layer between the substrate and the display elements and including a pixel circuit and an insulation layer;
    forming a second groove by removing a portion of the insulation layer of the pixel circuit layer to expose an upper surface of the first siloxane layer;
    filling the second groove with a second siloxane layer comprising siloxane;
    forming a third siloxane layer comprising siloxane on the second siloxane layer; and
    disposing a component below the substrate to overlap the first groove and the second groove,
    wherein
    the first and second base layers include a polymer resin and the first and second barrier layers include an inorganic material.

2. The method of claim 1, wherein
    the pixel circuit layer comprises a thin film transistor,
    each of the display elements comprises a pixel electrode electrically connected to the thin film transistor,
    the second siloxane layer is disposed to extend between the pixel electrode and the thin film transistor, and
    the third siloxane layer surrounds edges of the pixel electrode.

3. The method of claim 2, wherein the first siloxane layer is arranged between a bottom surface of the first groove and the second siloxane layer.

4. The method of claim 2, wherein a surface of the third siloxane layer and a surface of the second siloxane layer are arranged on a same plane such that there is no protruding portion between the third siloxane layer and the second siloxane layer.

5. The method of claim 2, wherein
    a surface of the third siloxane layer is higher than a surface of the second siloxane layer in an area where the first groove and the second groove overlap.

6. The method of claim 2, wherein
the third siloxane layer filled in the second groove and the third siloxane layer surrounding the edges of the pixel electrode are spaced apart from each other.

7. The method of claim 6, wherein
a height of a surface of the third siloxane layer filled in the second groove is substantially a same as a height of the third siloxane layer surrounding the edges of the pixel electrode.

8. The method of claim 2, wherein
a surface of the second siloxane layer is higher than a surface of the third siloxane layer in an area where the first groove and the second groove overlap.

9. The method of claim 1, wherein each of the organic layer first to third siloxane layers includes Si, O, or C-based siloxane.

* * * * *